United States Patent [19]

Weir

[11] 3,720,309

[45] March 13, 1973

[54] METHOD AND APPARATUS FOR SORTING SEMICONDUCTOR DICE

[75] Inventor: Basil Weir, San Jose, Calif.

[73] Assignee: Teledyne, Inc., Mountain View, Calif.

[22] Filed: Dec. 7, 1971

[21] Appl. No.: 205,502

[52] U.S. Cl. ........................209/73, 29/574, 29/580, 209/81

[51] Int. Cl. ..........................................B07c 5/344

[58] Field of Search ....209/81, 73; 29/593, 413, 580, 29/583, 574

[56] References Cited

UNITED STATES PATENTS 3,503,500 3/1970 Klossika..............................209/81 R 3,583,561 6/1971 Wiesler..................................29/413

*Primary Examiner*—Richard A. Schacher
*Attorney*—Paul D. Flehr et al.

[57] ABSTRACT

A method and apparatus therefor for sorting semiconductor dice from a monolithic wafer where after being data logged the wafer is placed on sticky tape located on an X,Y indexing table and a vacuum probe picks a single selected die from the wafer to a receiving table also having sticky tape. The receiving table is rotatable and also indexed along a radial line to allow matched pairs of semiconductor dice to be formed in adjacent concentric circles. A vacuum technique prevents damage to the individual dice while being picked. In addition, dice coordinate changes due to fracturing are compensated for.

6 Claims, 11 Drawing Figures

METHOD AND APPARATUS FOR SORTING SEMICONDUCTOR DICE

Background of the Invention

The invention relates generally to the sorting of semiconductor dice from a fractured wafer and more particularly to a method and apparatus for sorting matched pairs of semiconductor devices.

In the production of semiconductive devices from a monolithic wafer the individual devices on a given wafer have widely varying electrical characteristics. Thus, it is necessary to sort the individual dice of the wafer. One rather crude method used in the past was a pass-no-pass type where "defective" units were marked with ink and later discarded after the wafer was scribed and fractured into its individual dice. A later more sophisticated method is disclosed in U.S. Pat. No. 3,583,561 which sorts dice into several different classifications with each class being mounted on an individual packaging tape. However, where close pair matching is desired, the foregoing method and similar methods still require further processing both under computer control and by hand labor.

Objects and Summary of the Invention

It is, therefore, a general object of the present invention to provide an improved method and apparatus therefor for sorting semiconductor dice.

It is another object of the invention to provide a method and apparatus as above which is especially adaptable for close matching of die pairs.

It is another object of the invention to provide an improved apparatus for picking dice from the wafer after fracturing.

It is another object of the invention to provide a method of compensating for dimension changes in a wafer after fracturing.

In accordance with the above objects there is provided a method of sorting semiconductor dice from a monolithic wafer of dice. The dice are tested and the results related to the coordinate position of each die on the wafer. The wafer is fractured to divide the dice. Successive pairs of dice having related test results from the fractured wafer are then picked and placed in adjacent concentric circles on a receiving sheet of adhesive material.

Detailed Description of the Preferred Embodiment

Figure 1A:
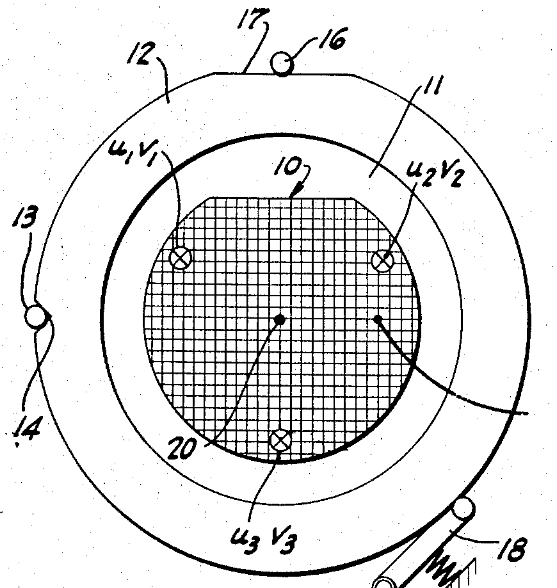
FIG. 1A is a plan view of a mounted semiconductor wafer.

FIG. 1A illustrates a fractured wafer 10 having three location coordinates, $U_1$, $V_1$, $U_2$, $V_2$, $U_3$, $V_3$. The fractured wafer is adhered to the sticky sheet material or tape 11. One type of tape which is suitable is produced by the 3M Company under the trademark "Scotch Protective Tape" No. Y–9143. Type 11 is retained in a plastic ring 12 which in turn is mounted on a X-Y table by a three point location system; this includes a pin 13 which fits into a V-groove 14 on ring 12, a pin 16 extending from the table which abuts a flat 17 on ring 12 and a biased spring lever 18.

At this stage the individual semiconductor devices on the dice of the wafer have been data logged. Standard semiconductor testers may be used for this purpose which can conduct several tests on each semiconductor device. Three points on the wafer now designated U, V in FIG. 1A but at the testing period designated X, Y allow the data logging device to correlate the location of the die with relation to the three reference points along with the test data. One normal method of locating a die on a wafer is measuring its position in mils. The position of the die on the wafer is denoted by two four digit numbers between 0000 and 9999. These numbers are generated using two up-down decimal counters which count the pulses to the motors of the test prober each of which moves the wafer one mil.

The present invention although having many applications finds preferred use for a field effect transistor (FET) matching program. It has been found that for FET matching two input readings may be taken. A particular way to help guarantee good temperature tracking is discussed in a paper having the inventor as one of the co-authors in the *Proceedings of the IEEE*, Volume 51, No. 7, July, 1963, entitled "Conditions for a Temperature Compensated Silicon Field Effect Transistor." This paper discusses why matching the $G_{fs}$ characteristic provides good temperature tracking. To obtain this characteristic two readings of voltage between the gate and the source, $V_{GS}$, are taken and then subtracted and their difference gives a number inversely proportional to $G_{fs}$ which is $V_{DIF}$. The operating point is provided by an average of the sum of the two $V_{GS}$ ratings which is $V_{AV}$. The terms $V_{AV}$ and $V_{DIF}$ are used for final matching as will be discussed below.

All of the data logging information is initially placed, for example, on punched cards by the initial testing apparatus and then processed by, for example, an IBM 360–25 computer. In order to designate which semiconductor devices of the wafer are to be matched, the user provides a limit table as shown below.

| Pass | $\pm\Delta V_{AV}$ | $\pm\Delta V_{DIF}$ | $\Delta X$ | $\Delta Y$ |
|---|---|---|---|---|
| 1 | 100 | 10 | 80 | 80 |
| 2 | 100 | 20 | 80 | 80 |
| 3 | 100 | 30 | 110 | 110 |

In the foregoing table the values $\Delta V_{AV}$ and $\Delta V_{DIF}$ represent the ± variation from an ideal value. For example, if a desired value of $V_{DIF}$ is typically 1,000 then $\Delta V_{DIF}$ of 10 would represent an allowable 1 percent variation. In Pass 2, which is initially conducted by a computer, pairs which have a 2 percent variation would be selected and so on. The $\Delta X$ and $\Delta Y$ define the distance in mils on the wafer that the search for proper matching will be conducted. This serves two purposes. First, decreasing the allowed physical separation improves temperature tracking. Secondly, the time for the operation of the sorting or picking procedure is decreased by limiting the travel of the picker mechanism. The units of the voltage values may be, for example, 10 millivolts.

While the foregoing describes a method for close matching of FET devices, several other procedures may, of course, be used where semiconductor devices or dice are separated into several different classifications.

After the listing of devices is completed the computer prepares a punched tape for the picker mechanism which will automatically move the picker through the list of dice in a sequence set up by the program so that the dice can be collected for inventory either in pairs or in general classifications. The punched tape used for the picker is generally used in conjunction with, for example, a SLO-SYN (Trademark) NC 300 system manufactured by the Superior Electric Company. The system drives indexing motors which are used extensively throughout the present invention.

However, the locations of the individual dice in an unfractured wafer are not the same as the locations of the same dice after fracturing or breaking. The reasons for this are two fold. First, although the wafer is retained on the same frame or plastic ring 12 and adhesive material layer 11, it must be taken from the testing device and moved to the picking or sorting system as illustrated in FIG. 1A. Also, it is extremely difficult to maintain the wafer in exact registration of displacement and rotation in the picker system to correspond to the values set up in the test probe system. A second reason that the coordinate locations are not the same is that the wafer expands slightly after breaking or fracturing. The extent of this expansion is approximately 3 mils per inch but is not consistent. Thus, the three reference coordinates designated in FIG. 1A as U, V, after fracturing must be related to the initial unfractured X, Y coordinates. From a mathematical standpoint the following assumptions may be made regarding the geometry of the fractured wafer to sustain the validity of the mathematical operations.

1. The wafer may be shifted up or down.
2. The wafer may be rotated as a whole by any angle.
3. Scribe lines remain straight in both directions.
4. The wafer may be uniformly stretched or shrunk independently in any two directions.

Within the limits of the foregoing assumptions there exist six constants, A, B, C, D, E and F which relate the coordinates of any die $X_i$, $Y_i$ on the unfractured wafer to $U_i$, $V_i$, the coordinates of the same die on the fractured wafer in the picker system by the expressions $$U_i = AX_i + BY_i + C$$

$$V_i = DX_i + EY_i + F$$

To find the six constants A through F, six simultaneous equations must be solved. These are obtained by measuring the coordinates of the three reference points in the unfractured wafer, i.e., X, Y and then again the three reference points in the fractured wafer, i.e., U, V to obtain 12 numbers:

$$X_1, Y_1, X_2, Y_2, X_3, Y_3,$$

$$U_1, V_1, U_2, V_2, U_3, V_3$$

To solve for A through F a Fortran routine using determinates may easily be produced by one skilled in the art. These constants are then used in conjunction with the above equations and $U_i$ and $V_i$ are solved for to produce new location coordinates for each die of the wafer. These are then punched into the tape used with the SLO-SYN NC 300 device.

Figure 1B:
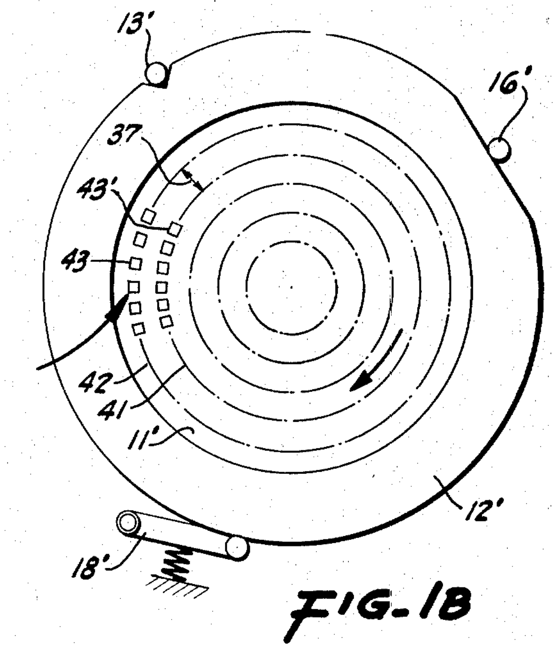
FIG. 1B is a plan view of semiconductor dice from the wafer of FIG. 1A after having been sorted.

The picker system itself for picking the individual die from the wafer on the X, Y table, as shown in FIG. 1A, and transferring it to the receiving table, as illustrated in FIG. 1B, in matched pairs may be divided into three parts. First, the X, Y control table (in more rigorous terms, U, V coordinates are used) which moves the wafer under a picking or vacuum probe; secondly, the picking mechanism itself which includes a vacuum probe and a needle to push the die free from the adhesive tape; and thirdly, the receiving table. This is illustrated in plan view in FIG. 2 where an X,Y table 21 retains ring 12 and wafer 10 by pins 13 and 16 and arm 18. The X,Y table is controlled by a tape driven electronic controller (not shown) such as the Superior Electric SLO-SYN NC 300 and positions the table at a point 20 directly under the vacuum probe 22 to select the die which is to be transferred to the receiving table 23.

Figure 3:
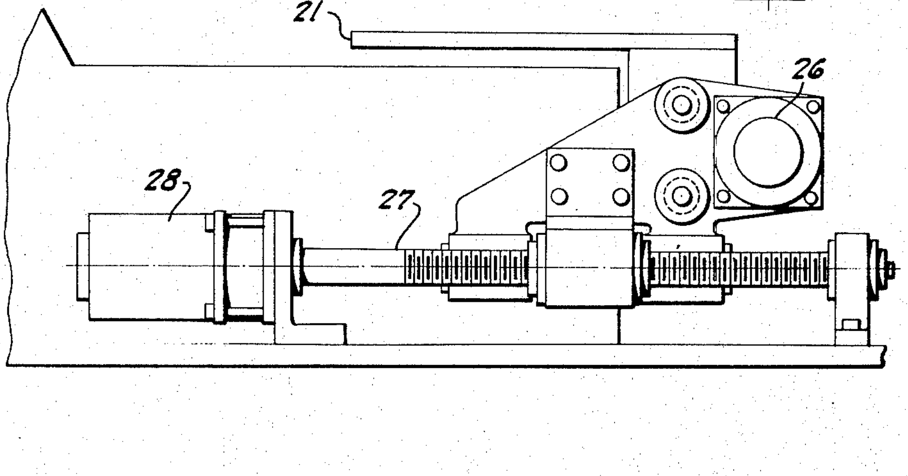
FIG. 3 is a side elevational view of FIG. 2.

Table 21 is operated in an open loop system meaning that only relative motions are made and absolute position is not sensed electrically. Table 21 is moved in an X direction by screw 24 and in the Y direction by screw 27 driven by motor 28. FIG. 3 is an elevation view showing especially the configuration of table 21.

Figure 4:
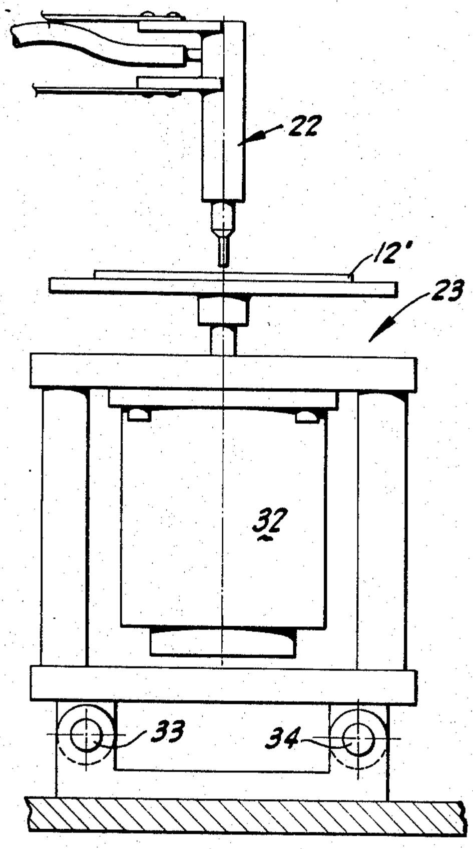
FIG. 4 is a front elevational view of a portion of FIG. 2.
Figure 5:
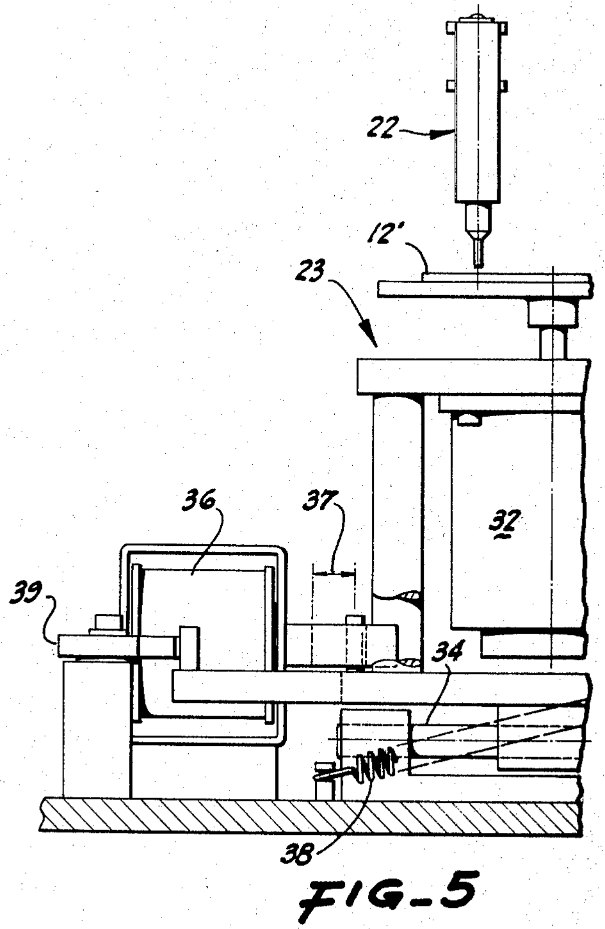
FIG. 5 is a side elevational view of FIG. 4.

Receiving table 23 contains a similar plastic ring 12' and sticky tape or adhesive tape 11' which is retained by pins 13' and 16' and by arm 18' and is moved in a direction R which is substantially parallel to the end of an arc 29 formed by the vacuum probe 22. The receiving table as best shown in FIGS. 4 and 5 includes a rotatable platform 31 which is indexed, for example, to 100 positions per revolution by an indexing motor 32. The entire receiving table 23 is mounted on ways 33 and 34 so that it may be displaced in the R direction (sideways) a short distance so that successive concentric rings of matched dice can be put down on the adhesive tape 11'. This is accomplished as shown in FIG. 5 by a solenoid 36 which moves the table 23 one index position sideways or one stroke as indicated at 37 against the bias of a spring 38. This distance is also illustrated in FIG. 1B. A cam 39 best illustrated in FIG. 2 has three flat surfaces which allows solenoid 36 to index between three separate pairs of concentric rings. In FIG. 1B rings 41 and 42 are illustrated where, for example, dice 43 and 43' would be a matched pair.

Figure 2:
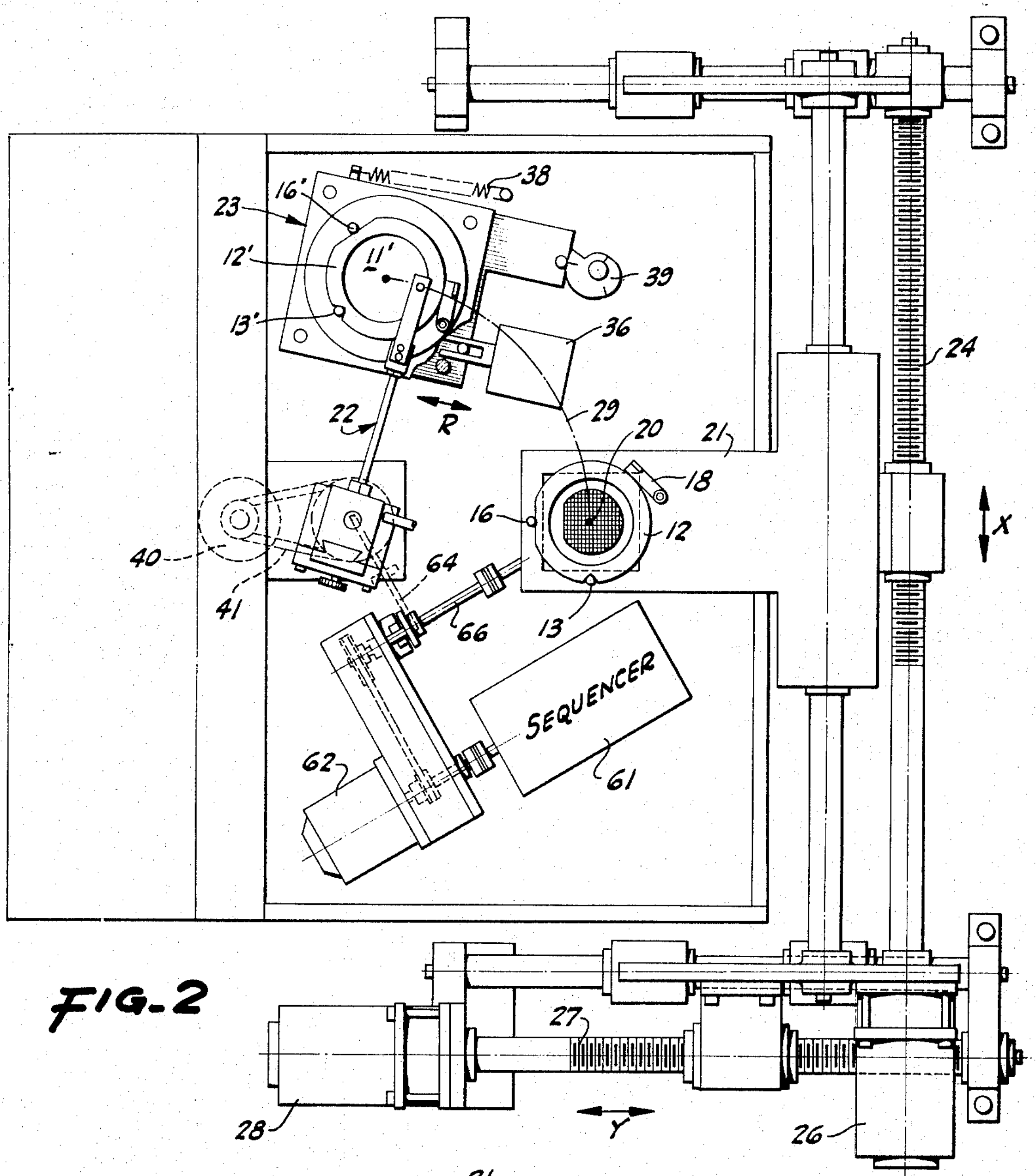
FIG. 2 is a plan view of the overall apparatus incorporating the present invention.
Figures 6, 7:
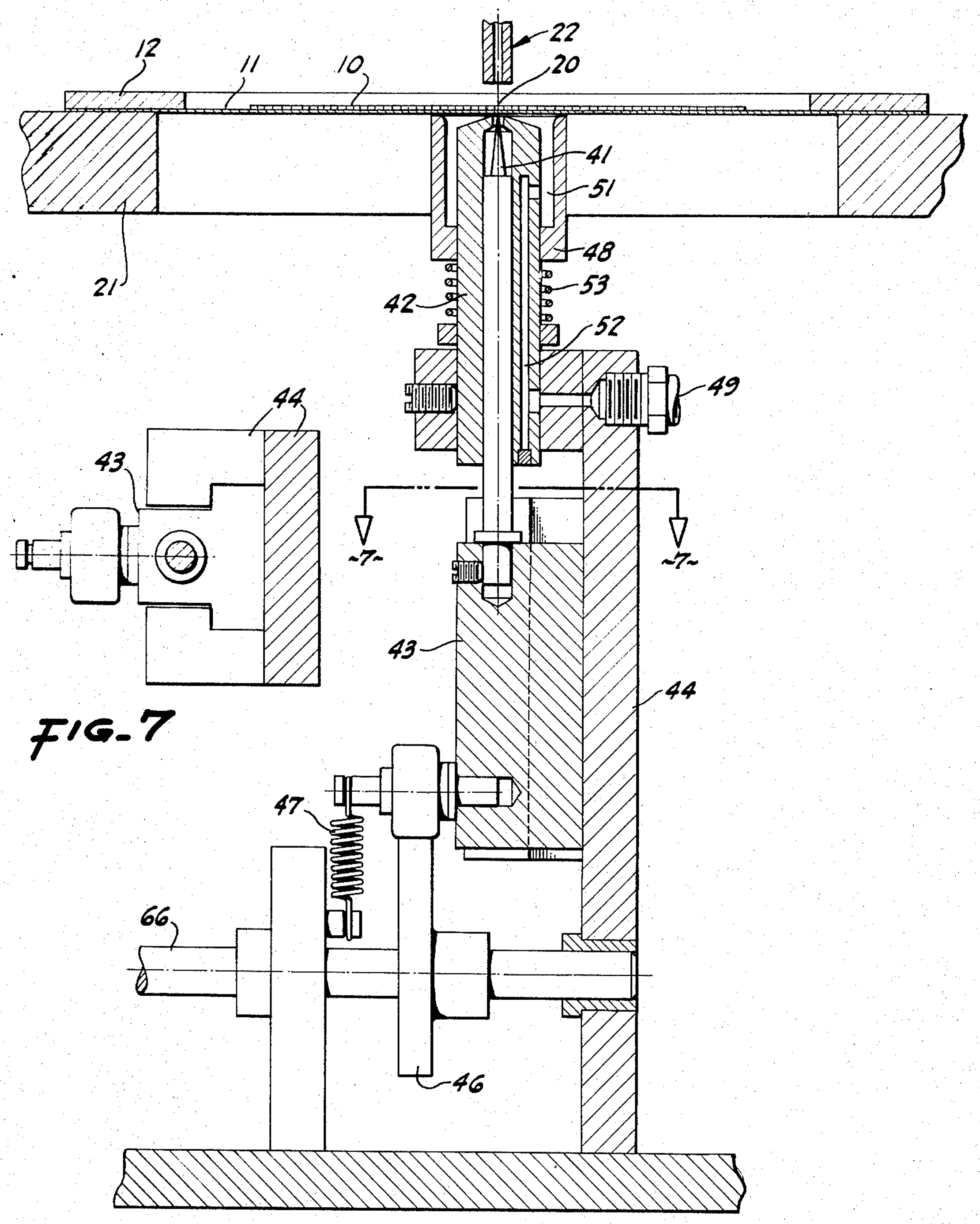
FIG. 6 is an elevational view of another portion of FIG. 2.
FIG. 7 is a cross sectional view taken along the line 7—7 of FIG. 6.
Figure 8A:
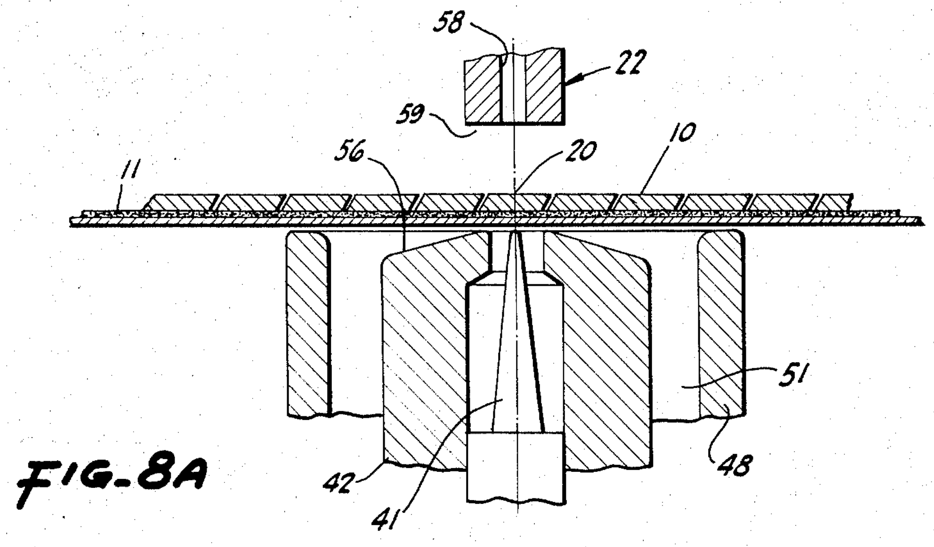
FIGS. 8A - 8C are enlarged detail views of a portion of FIG. 6 showing different operating positions.

In addition to the X, Y table 21 and receiving table 23 the third portion of the picking system is the picking mechanism itself. This includes the vacuum probe or pickup 22 as illustrated in FIG. 2 which swings on an arc 29 between the center point 20 and over the receiving table 23. A motor 40 and belt 41, both shown in dashed outline, provide for such swing. Beneath point 20 are pusher means juxtaposed with the vacuum probe 22. The pusher means includes a sharp pointed pusher needle 41 which is slidable in a holder 42 between a rest position as indicated in FIG. 8A and an activated position as indicated in FIG. 8C. Needle 41 is coupled to a cam follower unit 43 (FIG. 6) slidably mounted on a frame 44 which is driven by a cam 46 against the tension of a spring 47. FIG. 7 better shows cam follower 43 and the frame 44. A vacuum collar 48 surrounds the needle holder 42 and forms a cavity which includes a portion of the opposite side of adhesive tape 11 relative to wafer 10. Means are provided for drawing a vacuum in the cavity by a vacuum hose connection which communicates with the cavity 51 formed by the collar 48 through a channel 52. The vacuum or collar 48 is floated by means of the spring 53 so that it is normally urged against the bottom side of adhesive material 11.

Figure 8B:
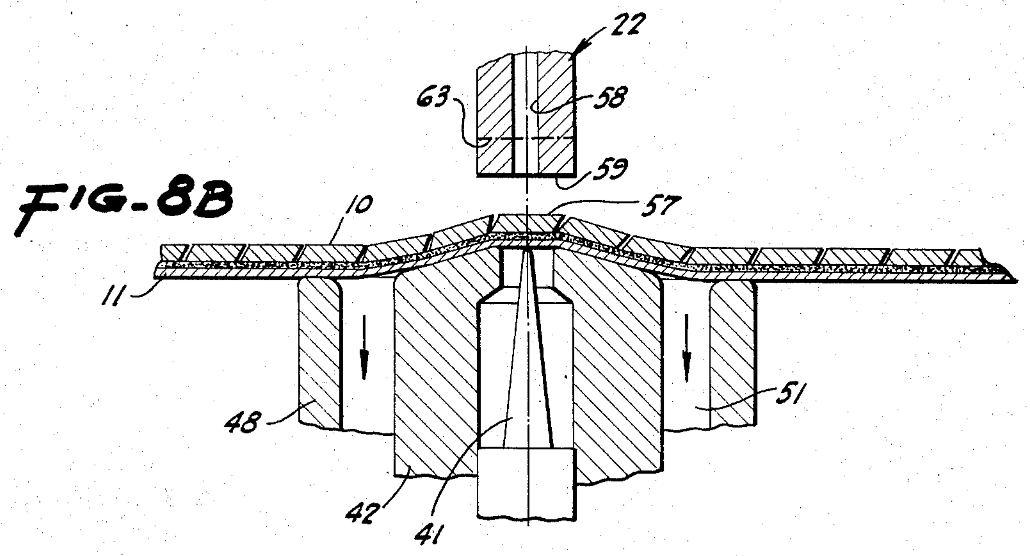
Figure 8C:
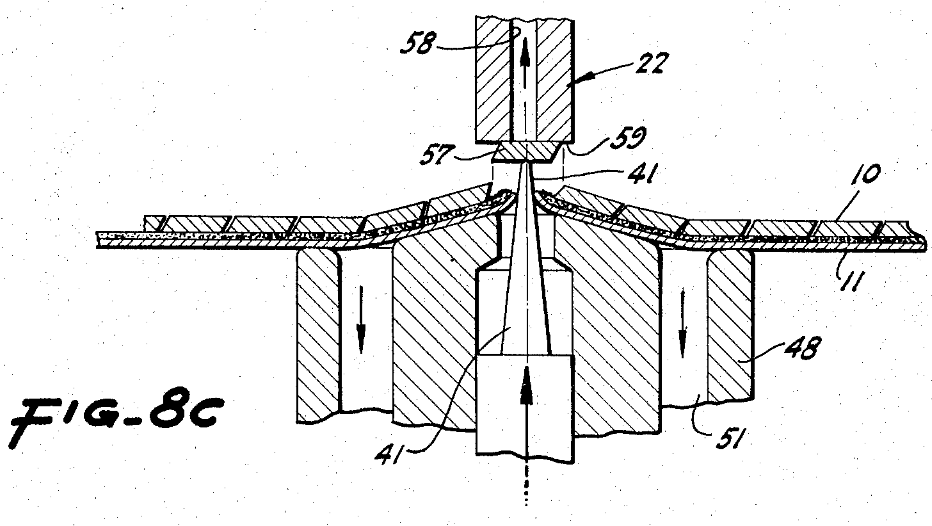

As best illustrated in FIGS. 8A through 8C the needle holder 42 includes a conically shaped end 56 for contacting the adhesive material 11. As a vacuum is drawn in cavity 51 as illustrated in FIG. 8B, adhesive tape 11 along with wafer 10 is made to conform the shaped end 56. This avoids a "hinging" effect of neighboring dice when the central dice, for example, at 57 is removed. Such hinging would normally result in damage to the edge of the die when it is forced from the wafer since it will interlock with neighboring dice. In addition, the hinging effect may cause the die to rotate or slip sideways and thus cause scuffing by the vacuum probe means to damage the components on the die. The foregoing difficulties are avoided by the shaped end 56 and the use of a vacuum in cavity 51. The conical shape of end 56 opens up the crack between the dice and in addition the vacuum causes the needle 41 to cleanly pierce as illustrated in FIG. 8C the sticky or adhesive material 11 to push the die 57 upwardly so that is is engaged and retained by vacuum probe 22. The diameter of the vacuum probe is slightly larger than the die being picked to eliminate any scuffing since there are no edges of probe 22 which will contact the die. The inner hole 58 of the probe 22 also has edges but these cannot scuff since the planar surface of the face never allows them to meet the die surface in a mode which will cause scratching.

The face 59 of vacuum probe 22 might alternately instead of being flat be in the shape of a shallow internal cone or pyramid.

The sequence of the picking operation is to place the vacuum probe 22 above the point 20 with the X,Y table 21 adjusted so that the desired die on the wafer is at point 20 and thus between top vacuum probe and the bottom needle 41. A timing sequencer illustrated by the box 61 activates a motor 62 which lowers probe 22 to the position shown in FIG. 8B from the dashed line position 63. This is accomplished by the shaft 64 (FIG. 2) at the same time the shaft 66 cams the needle 41 as illustrated in FIG. 6. The needle pushes the die off the adhesive tape and the vacuum on vacuum probe 22 pulls the die while its swinging arm carries it to the receiving table where it is deposited. Previous to this movement the receiving table has been indexed to a proper receiving position under the control of the punched control tape which controls the X,Y table motion also.

Ring or frame 12' with its array of selected dice also provides for high density secure storage in an air tight container which can easily be shipped long distances. The concentric paired array is ideally suited for use in final assembly in which dice are transferred to headers. The polar or radial array provides pre-sorted and arranged dice for direct transfer of matched dice. Moreover, the picking need be performed only for as many as required.

Thus, the present invention has provided an improved method and apparatus therefor for sorting semiconductor devices. Moreover, it is especially adaptable for close matching of die pairs. Apparatus is also provided for compensating for the expansion or shrinkage of the wafer after fracturing or breaking to provide for accurate picking. In addition during the actual picking operation damage to the wafer is prevented while it is moved into engagement with a vacuum probe.

I claim:

1. A method of sorting semiconductor dice from a monolithic wafer of said dice, comprising the steps of, testing said dice and relating the test results to the coordinate position of each die on the wafer, fracturing said wafer to divide said dice, successively picking pairs of dice having related test results from said fractured wafer and placing said pairs in adjacent concentric circles on a receiving sheet of adhesive material.

2. A method as in claim 1 where in said testing of said dice at least three X, Y coordinate points are located on said wafer and including the step after fracturing of said wafer obtaining new coordinate points, U, V, of said three X, Y reference points and relating said U, V points to said X, Y points by $$U_i = AX_i + BY_i + C$$

$$V_i = DX_i + EY_i + F$$

where A – F are constants, whereby stretching of the wafer during fracturing is compensated.

3. Apparatus for sorting semiconductor dice from a monolithic wafer comprising: a sheet of adhesive material to which said wafer is adhered; vacuum probe means positionable over the exposed side of a predetermined die; pusher means juxtaposed with said vacuum needle on the side of said material opposite the side to which said wafer is adhered including, a sharp pointed pusher needle operable from a rest position to an activated position for piercing said material and freeing said predetermined die from said adhesive material; needle holder means in which said needle is slidable between said rest and activated positions, said holder means having a shaped end for contacting said opposite side of said material; vacuum means surrounding said holder means for forming a cavity which includes a portion of said opposite side of said material for causing said material to conform to said shaped end; means for drawing a vacuum in said cavity and means for sliding said needle from said rest position to said activated position.

4. Apparatus as in claim 3 where said means for sliding said needle concurrently lowers said vacuum probe toward said predetermined die.

5. Apparatus as in claim 3 where said vacuum probe has an end diameter slightly greater than the diameter of said dice.

6. Apparatus for sorting semiconductor dice from a fractured wafer which is retained on a sheet of adhesive material comprising: X-Y indexing table means on which said material and wafer is mounted; rotatable receiving table means also movable in a radial direction including means for retaining a sheet of adhesive material, vacuum probe means mounted on an arm swingable between said indexing table means and receiving table means; and means for indexing said receiving table in said radial direction between two positions whereby with rotation of said table said vacuum probe means can deposit concentric circles of said dice.

* * * * *